(12) United States Patent
Rivoir

(10) Patent No.: US 11,182,274 B2
(45) Date of Patent: Nov. 23, 2021

(54) TEST APPARATUS FOR PERFORMING A TEST ON A DEVICE UNDER TEST AND DATA SET FILTER FOR FILTERING A DATA SET TO OBTAIN A BEST SETTING OF A DEVICE UNDER TEST

(71) Applicant: Advantest Corporation, Tokyo (JP)

(72) Inventor: Jochen Rivoir, Magstadt (DE)

(73) Assignee: Advantest Corporation, Tokyo (JP)

( * ) Notice: Subject to any disclaimer, the term of this patent is extended or adjusted under 35 U.S.C. 154(b) by 21 days.

(21) Appl. No.: 16/546,083

(22) Filed: Aug. 20, 2019

(65) Prior Publication Data

US 2020/0019491 A1 Jan. 16, 2020

Related U.S. Application Data

(63) Continuation of application No. PCT/EP2017/055371, filed on Mar. 7, 2017.

(51) Int. Cl.
*G06F 9/44* (2018.01)
*G06F 9/445* (2018.01)
(Continued)

(52) U.S. Cl.
CPC ...... *G06F 11/3676* (2013.01); *G06F 11/3684* (2013.01); *G06F 11/3688* (2013.01); *G06F 11/3692* (2013.01)

(58) Field of Classification Search
CPC ............. G06F 11/3676; G06F 11/3684; G06F 11/3688; G06F 11/3692
See application file for complete search history.

(56) References Cited

U.S. PATENT DOCUMENTS 5,615,380 A 3/1997 Hyatt
6,577,982 B1 * 6/2003 Erb ..................... G06F 11/3684
702/120

(Continued)

FOREIGN PATENT DOCUMENTS

CN 104881359 A * 9/2015

OTHER PUBLICATIONS

Silvia Cateni, Variable Selection and Feature Extraction Through Artificial Intelligence Techniques, 2013, pp. 1-16. https://www.intechopen.com/books/multivariate-analysis-in-management-engineering-and-the-sciences/variable-selection-and-feature-extraction-through-artificial-intelligence-techniques (Year: 2013).*

(Continued)

*Primary Examiner* — Mongbao Nguyen

(57) ABSTRACT

A test apparatus for performing a test on a device under test includes a data storage unit being configured to store sets of input data applied to the device under test during the test and to store the respective output data of the device under test, the output data being obtained from the device under test as a response to the input data including values of setting variables related to settings of the device under test and values of input variables including further information, each set of input data representing one test case; and a data processor configured to process the data stored in the data storage unit such that a best combination of setting variables of the device under test is determined for one or more combinations of the input variables to obtain an optimized setting of the device under test for the one or more combinations of the input variables.

13 Claims, 4 Drawing Sheets

(51) Int. Cl.
*G06F 9/455* (2018.01)
*G06F 11/36* (2006.01)

(56) References Cited

U.S. PATENT DOCUMENTS

| | | | |
|---|---|---|---|
| 6,885,700 B1 | 4/2005 | Kim et al. | |
| 8,706,062 B1 | 4/2014 | Yu et al. | |
| 2003/0058148 A1 | 3/2003 | Sheen | |
| 2005/0104597 A1 | 5/2005 | Klijn et al. | |
| 2005/0114105 A1* | 5/2005 | Barber | G05B 17/02 703/2 |
| 2005/0154559 A1* | 7/2005 | Jager | G06F 11/3684 702/182 |
| 2005/0172181 A1 | 8/2005 | Huliehel | |
| 2009/0006066 A1 | 1/2009 | Behm et al. | |
| 2009/0018793 A1 | 1/2009 | Sakarovitch et al. | |
| 2009/0150733 A1* | 6/2009 | Takizawa | G01R 31/3191 714/734 |
| 2010/0058131 A1* | 3/2010 | Furukawa | G01R 31/31813 714/738 |
| 2010/0176815 A1 | 7/2010 | Roth | |
| 2011/0032829 A1* | 2/2011 | Rivoir | G01R 31/2846 370/242 |
| 2011/0161263 A1* | 6/2011 | Lee | G06Q 30/00 706/13 |
| 2011/0227767 A1 | 9/2011 | O'Brien | |
| 2012/0226465 A1* | 9/2012 | Mizuno | G06F 11/3684 702/123 |
| 2012/0330598 A1* | 12/2012 | Mizuno | G06F 11/3688 702/123 |
| 2013/0298102 A1* | 11/2013 | Kadkade | G06F 30/00 716/136 |
| 2014/0013290 A1* | 1/2014 | Lyons, Jr. | G06F 30/30 716/106 |
| 2014/0195870 A1 | 7/2014 | Ma | |
| 2014/0336958 A1* | 11/2014 | Rivoir | G01R 31/316 702/59 |
| 2018/0024175 A1* | 1/2018 | Quan | H04R 29/001 398/193 |

OTHER PUBLICATIONS

Rohde & Schwarz, Measuring with Modern Spectrum Analyzers, 2013, pp. 1-127. https://cdn.rohde-schwarz.com/pws/dl_downloads/dl_application/application_notes/1ma201_1/1MA201_9e_spectrum_analyzers_meas.pdf (Year: 2013).*

Zhanglei Wang, Test-Quality/Cost Optimization Using Output-Deviation-Based Reordering, 2007, pp. 352-365. http://citeseerx.ist.psu.edu/viewdoc/download?doi=10.1.1.111.828&rep=rep1&type=pdf (Year: 2007).*

Zhanglei Wang, Test-Quality/Cost Optimization Using Output-Deviation-Based Reordering of Test Patterns, 2008, pp. 352-365. https://ieeexplore.ieee.org/stamp/stamp.jsp?tp=&arnumber=4359935&isnumber=4435957 (Year: 2008).*

D. Richard Kuhn, Measuring and Specifying Combinatorial Coverage of Test Input Configuations, 2016, pp. 1-29. https://www.researchgate.net/publication/283790215_Measuring_and_Specifying_Combinatorial_Coverage_of_Test_Input_Configurations (Year: 2016).*

Wang, Z., et al."Test-Quality/Cost Optimization Using Output-Deviation-Based Reordering of Test Patterns" IEEE Trans. Comput.-Aided Design Integr. Circuits Syst., vol. 27, No. 2, pp. 352-365.

* cited by examiner

TEST APPARATUS FOR PERFORMING A TEST ON A DEVICE UNDER TEST AND DATA SET FILTER FOR FILTERING A DATA SET TO OBTAIN A BEST SETTING OF A DEVICE UNDER TEST

CROSS-REFERENCE TO RELATED APPLICATIONS

This application is a continuation of copending International Application No. PCT/EP2017/055371, filed Mar. 7, 2017, which is incorporated herein by reference in its entirety.

BACKGROUND OF THE INVENTION

The present invention relates to a test apparatus for performing a test on a device under test and a data set filter for filtering a data set to obtain a best setting of the device under test. The data set filter may be part of the device under test. According to embodiments, an optimization in a test case database is shown, wherein the test case database or a data storage unit may comprise multiple sets of input data and respective output data.

Calibration/correction & FW (firmware) optimization shall find the best device settings (y) as a function of known information (x). This is a multivariate optimization problem. The usual method changes y iteratively, and measures the optimization target (g) for all values of x in each iteration. Known optimization algorithms operate on algorithmic representations of functions that shall be optimized.

Therefore, classification algorithms may calculate a function of best setting variables dependent on the input of known information (x). Deriving good results from these classification or regression algorithms involves a deep knowledge of the used algorithm to find the optimal result and not to remain in a local minimum only representing a non-optimal result. Moreover, these algorithms are computationally complex and therefore very time consuming.

SUMMARY

According to an embodiment, a test apparatus for performing a test on a device under test may have: a data storage unit configured to store sets of input data applied to the device under test during the test and to store the respective output data of the device under test, wherein the output data is acquired from the device under test as a response of the device under test to the input data, wherein the input data has values of setting variables related to settings of the device under test and values of input variables having further information, wherein each set of input data represents one test case; and a data processor configured to process the data stored in the data storage unit such that a best combination of setting variables of the device under test is determined for one or more combinations of the input variables to acquire an optimized setting of the device under test for the one or more combinations of the input variables.

Another embodiment may have a data set filter for filtering a data set to acquire a best setting of a device under test for current input variables using an optimization vector, the optimization vector representing a relation between an index of input variables and an index of a combination of setting variables indicating the best setting of the device under test.

According to another embodiment, a method for performing a test on a device under test may have the steps of: storing sets of input data applied to the device under test during the test; storing the respective output data of the device under test derived from the device under test as a response of the device under test to the input data, wherein the input data has values of variables related to settings of the device under test and values of input variables having known information, wherein each set of input data represents one test case; and processing the data stored in the data storage unit such that the best setting of the device under test for one or more combinations of the further variables is determined.

According to another embodiment, a method for filtering a data set to acquire a best setting of the device under test for current input variables using an optimization vector may have the step of: forming the optimization vector representing a relation between an index of input variables and an index of a combination of setting variables indicating the best setting of the device under test.

Another embodiment may have a non-transitory digital storage medium having a computer program stored thereon to perform the method for performing a test on a device under test, the method having the steps of: storing sets of input data applied to the device under test during the test; storing the respective output data of the device under test derived from the device under test as a response of the device under test to the input data, wherein the input data comprises values of variables related to settings of the device under test and values of input variables having known information, wherein each set of input data represents one test case; and processing the data stored in the data storage unit such that the best setting of the device under test for one or more combinations of the further variables is determined, when said computer program is run by a computer.

Another embodiment may have a non-transitory digital storage medium having a computer program stored thereon to perform the method for filtering a data set to acquire a best setting of the device under test for current input variables using an optimization vector, the method having the step of: forming the optimization vector representing a relation between an index of input variables and an index of a combination of setting variables indicating the best setting of the device under test, when said computer program is run by a computer.

Embodiments of the present invention show a test apparatus for performing a test on a device under test. The test apparatus comprises a data storage unit and a data processor. The data storage unit is configured to store sets of input data applied to the device under test during the test and to store the respective output data of the device under test. The output data may be obtained from the device under test as a response of the device under test to the input data, wherein the input data comprises values of setting variables related to settings of the device under test and values of input variables comprising further information. Each set of input data represents one test case. Moreover, the data processor is configured to process the data stored in the data storage unit such that a best combination of setting variables of the device under test is determined for one or more combinations of the input variables to obtain an optimized setting of the device under test for the one or more combinations of the input variables.

The present invention is based on the finding that it is advantageous to derive the optimal settings of the device under test directly from the database, i.e. the data storage unit, by omitting the cumbersome step of deriving a function representing the setting parameters of the device under test based on current input data. This speeds up the total optimization process and is furthermore less error prone. The proposal here is to create and store a large number of test cases in a test case database, where the optimization target has been measured for many different values of x and y. This database is then analyzed to find the optimal function y(x) and to verify the optimization result.

Therefore, if not already present, a countable number of possible values of input variables and a countable number of possible variable values of setting variables is determined, for example, by quantizing input and/or setting variables having too many potential values when operating the device under test. This may be real or integer variables, etc. Moreover, according to embodiments, the data storage unit is transformed into a new (further, second) database (table, matrix, list) where all possible combinations of input variables are applied or located along a first dimension of the database and all possible combinations of setting variables are located along a second dimension of the further database. Entries of the further database may be an index of the current test case to link the respective input variables and setting variables of a common test case and furthermore to link the original or non-quantized data of the database or the data storage unit to the quantized values of the further database.

According to further embodiments, the indices of test cases within the entries or fields of the further database are weighted based on the optimization target (g). Each input of the non-quantized values of the input variables and setting variables of a single test case result in a (unique) value of the optimization function (g) or a derivative thereof, such as for example the figure of merit (f). For each value or combination of the first dimension, the best result of the optimization function within the second dimension is determined. A position of the determined result indicates the (quantized) combination of values of setting variables representing a best setting of the device under test for each possible combination of input variables.

The filtering of the data set may be performed by a data set filter to obtain a best setting of a device under test for current input variables using an optimization vector. The optimization vector represents a relation between an index of input variables and an index of a combination of setting variables indicating the best setting of the device under test. Embodiments show that the data set filter is part of the test apparatus. Therefore, the optimization vector p may be calculated using the data processor or the test apparatus.

BRIEF DESCRIPTION OF THE DRAWINGS

Embodiments of the present invention will be detailed subsequently referring to the appended drawings, in which.

DETAILED DESCRIPTION OF THE INVENTION

In the following, embodiments of the invention will be described in further detail. Elements shown in the respective figures having the same or a similar functionality will have associated therewith the same reference signs.

Figure 1:
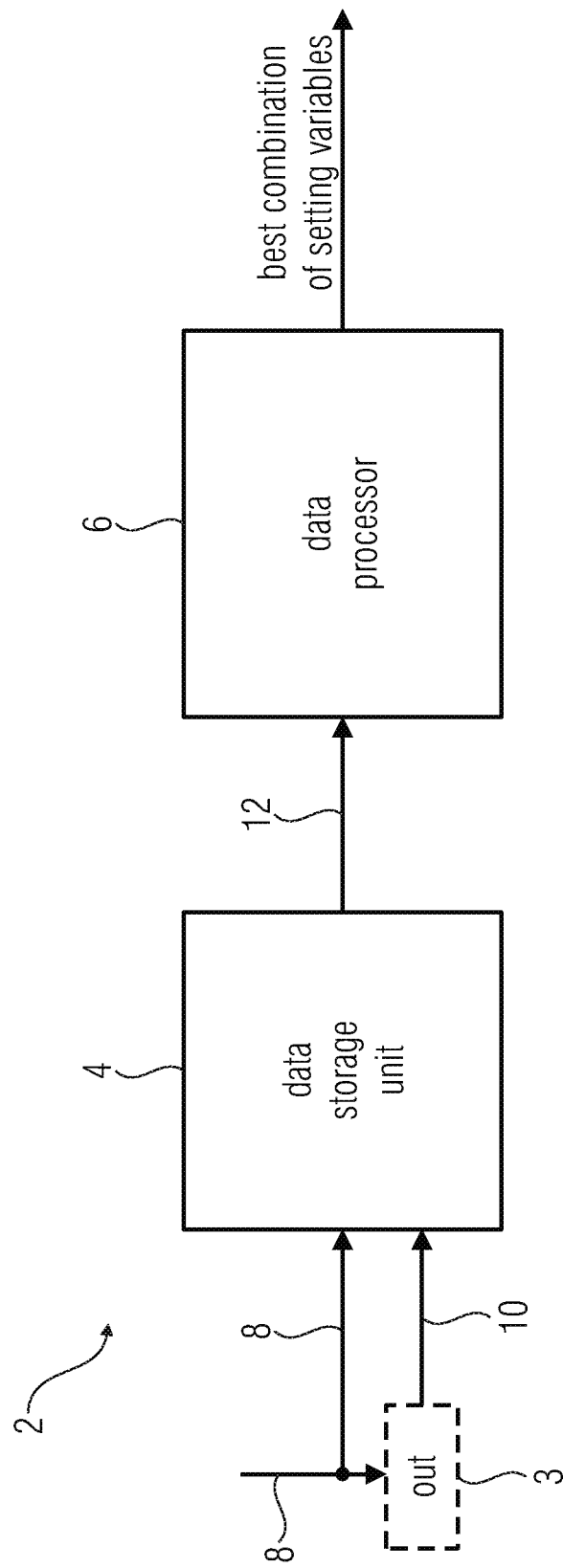
FIG. 1 shows a schematic block diagram of the test apparatus.

FIG. 1 shows a schematic block diagram of the test apparatus 2 for performing a test on a device under test. The test apparatus 2 comprises a data storage unit 4 and a data processor 6. The data storage unit is configured to store sets of input data 8 applied to the device under test 3 (drawn with dashed lines since it is not part of the test apparatus) during the test and to store the respective output data 10 of the device under test. The output data 10 is obtained from the device under test as a response of the device under test to the input data 8. The input data 8 comprises values of setting variables related to settings of the device under test and values of input variables comprising further information. Each set of input data represents one test case. Moreover, the data processor 6 is configured to process the data 12 stored in the data storage unit 4 such that a best combination of setting variables of the device under test is determined for one or more combinations of the input variables to obtain an optimized setting of the device under test for the one or more combinations of the input variables. The further information may comprise at least one of a stimulus waveform, an input pattern, a stimulus signal, an environment condition, or an environment status.

Figure 2:
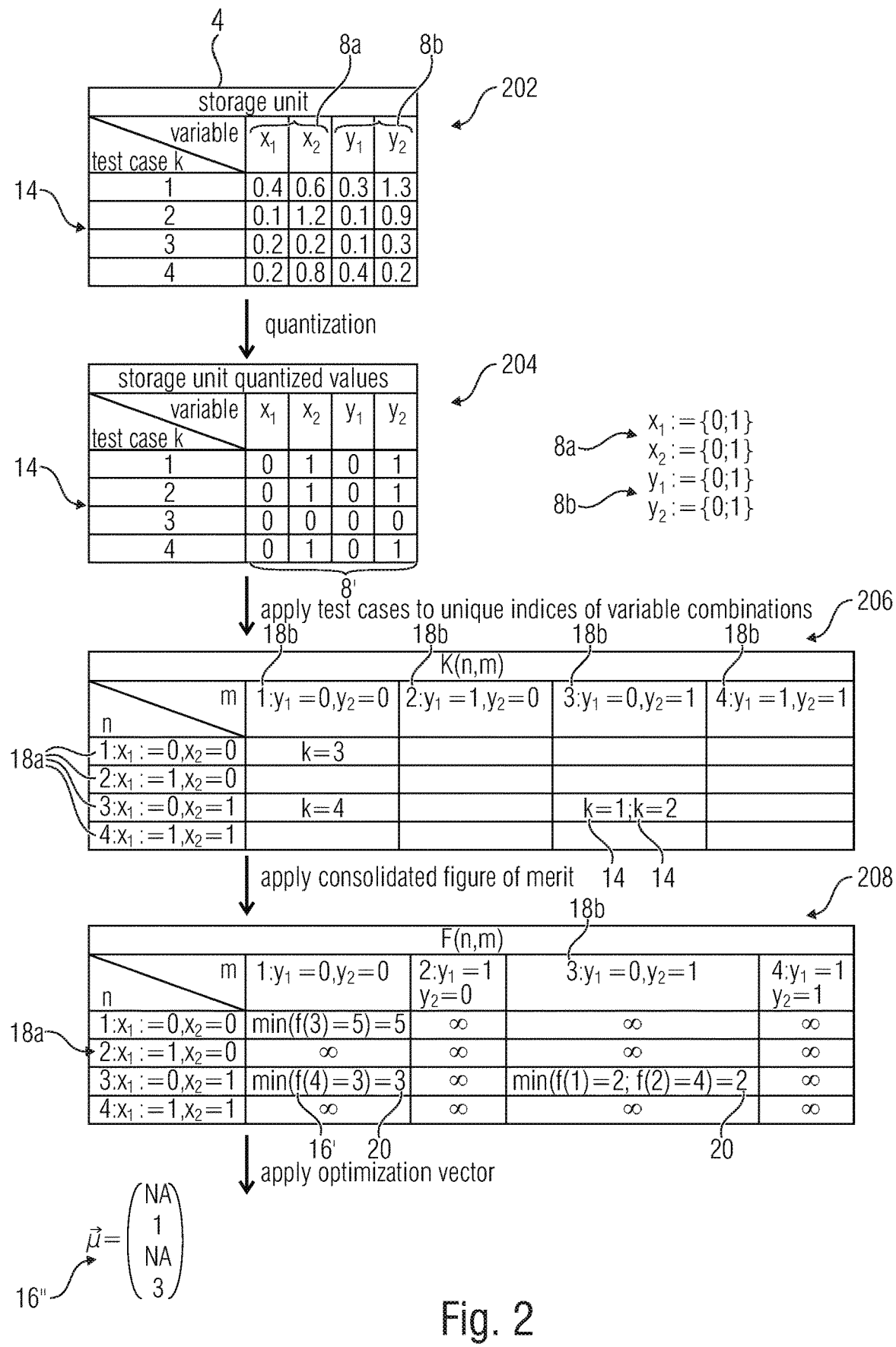
FIG. 2 shows an exemplary flow diagram showing an exemplary data set and the respective tables of corresponding processing steps to derive the best settings of the device under test.

FIG. 2 shows a schematic flow diagram with a sequence of exemplary tables 202, 204, 206, 208 representing results of selected steps which may be performed by the data processor to derive the best settings 11 of the device under test, e.g. represented by the parameter vector 16". The best setting of the device under test may refer to a (optimal or best) combination of values of the setting variables for a current set of values of input variables. The first table 202 shows a short extract or a short excerpt of the data storage unit 4 showing four different test cases 14. Moreover, the data storage unit comprises input variables $x_1$ and $x_2$ 8a and setting variables $y_1$ and $y_2$ 8b. Output data of the device under test has been omitted for simplification.

In other words, given is a table (database, data storage unit) 4 with K test cases 14, k=1 . . . K with multiple variables.

The goal is to find the (best) values of Q variables $y(k)=y_1(k), \ldots, y_Q(k)$ as a function of P variables $x=x_1(k), \ldots, x_P(k)$ that optimize variable values g(k). Optionally, test cases with the optimum combination of x variables and y variables are selected.

Variables $x_p$ and $y_q$ can be real-valued, integer, Boolean, categorical, or of any other suitable data type.

The user can specify whether a good value of variable g is a. small or
  b. large or
  c. deviates little from a desired value $g_0$ or
  d. deviates a lot from an undesired value $g_0$.

The user can chose to find the

A. best worst case or
  B. best average or
  C. best (best) case

According to embodiments, the data processor 6 is configured to perform a quantization of the input data 8 of at least one input variable 8a and/or setting variable 8b to form a discrete representation 8' of the input data. Therefore, the data processor may process the discrete representation 8' of the input data 8 such that the best setting of the device under test 3 for the one or more combinations of the input variables 8a is determined. This is advantageous, since it forms a countable or discrete number or amount of possible value combinations of all input variables 8a and/or setting variables 8b.

In other words, if variables $x_p(k)$ or $y_q(k)$ take on too many values in k=1 ... K (e.g. when they are real valued or integer), their values are quantized to $N_p$ discrete values for variables $x_p$ and $M_q$ different discrete values for variables $y_q$. For Boolean or categorical variables, quantization is not necessary.

$$x_{p,1}, x_{p,2}, \ldots, x_{p,N_p} \text{ for } p=1 \ldots P$$

$$y_{q,1}, y_{q,2}, \ldots, y_{q,M_q} \text{ for } q=1 \ldots Q \quad (1)$$

Variables values $x_p(k)$ and $y_q(k)$ can now be represented as indices, $1 \leq n_p(k) \leq N_p$, and $1 \leq m_q(k) \leq M_q$.

$$n_p(k): x_p(k) = x_{p,n_p(k)}$$

$$m_q(k): y_q(k) = y_{q,m_q(k)} \quad (2)$$

To simplify notation, from now on, $x_p(k)$ and $y_q(k)$, refer to the quantized variable values 8'.

The second table 204 shows the storage unit with quantized values as a result of the quantization of the first table 202 representing the storage unit 4. The quantization to integer values is exemplary and may be further applied to any other quantization pattern or quantization steps.

According to a further embodiment, all possible combinations of input variables 8a and setting variables 8b may be assigned or allocated to a (unique) placeholder or value or representative, such as for example an integer value. In other words, after quantization, there are $N = N_1 \cdot N_2 \cdot \ldots \cdot N_P$ different combinations $x_n$ of variable values. For each test k, the combination x(k) is described by an index n(k)=1 ... N, such that $$x_{n(k)} = x(k), \quad (3)$$

which can e.g. be computed as $$n(k) = 1 + (n_1(k) - 1) + (n_2(k) - 1)N_1 + (n_3(k) - 1)N_1 N_2 + \ldots \quad (4)$$

$$= 1 + \sum_{p=1}^{P} (n_p(k) - 1) \prod_{i=1}^{p-1} N_i$$

For a given n, the reverse mapping is $$n_1 = n \ \% \ N_1 \quad (5)$$

$$n_2 = \text{round}\left(\frac{n}{N_1}\right) \ \% \ N_2$$

$$\ldots$$

$$n_p = \text{round}\left(\frac{n}{\prod_i^{p-1} N_i}\right) \ \% \ Np$$

where '%' denotes the modulo operation.

Similar for variables y:

$$y_{m(k)} = y(k) \quad (6)$$

$$m(k) = 1 + (m_1(k) - 1) + (m_2(k) - 1)M_1 + (m_3(k) - 1)M_1 M_2 + \ldots \quad (7)$$

$$= 1 + \sum_{p=1}^{P} (m_p(k) - 1) \prod_{j=1}^{p-1} M_j,$$

-continued $$m_q = \text{round}\left(\frac{m}{\prod_j^{q-1} M_j}\right) \ \% \ M_q \quad (8)$$

In other words, the data processor 6 is configured to assign a unique value to each possible combination of input variables and/or to each possible combination of setting variables. More specifically, the data processor 6 is configured to assign the unique value to each possible combination of input variables 8a using formula (4), where k is the current test case, n(k) is the unique value of each possible combination of input variables, $n_p(k)$ is an index representing possible values of the input variable p, P is the total number of input variables p, and $N_i$ is the total number of possible values of input variable i. Additionally or alternatively, the data processor 6 is configured to assign the unique value to each possible combination of setting variables using formula (7) where k is the current test case, m(k) is the unique value of each possible combination of setting variables, $m_p(k)$ is an index representing possible values of the setting variable p, P is the total number of setting variables p, and $M_j$ is the total number of possible values of setting variable j.

According to further embodiments, the data processor 6 may assign indices representing the test cases 14 to a respective combination of input variables 8a of each possible combination of input variables and to a respective combination of setting variables 8b of each possible combination of setting variables. The aforementioned assignment may be formed or applied in a table 206 such that a position along the first dimension of the table indicates a unique value 18a of a current input variable 8a within all possible combinations of input variables and/or a position along the second dimension of the table 206 indicates a unique value 18b of a current setting variable 8b within all possible combinations of setting variables. This is advantageous, since each test case representing the used non-quantized values, is directly related to the quantized representation thereof and therefore, an output or a result of the optimization value with non-quantized values may be calculated and assigned directly to the quantized representation and is easily accessible by means of computer programming languages.

In other words, test cases for combinations of x and y shall be found. This may be applied by identifying the sets $\mathcal{K}(n,m)$ of test cases for all combinations n=1 ... N of variables x and all combinations m=1 ... M of variables y.

$$\mathcal{K}(n,m) = \{k: (x(k) = x_n) \wedge (y(k) = y_m)\} \quad (9)$$

Note, this set (or each field) can contain no or one or multiple test cases or indices thereof, which causes no problem in the following steps. No test cases may be applied or derived, if the test does not cover all possible variable combinations, e.g. if the test is aborted before the test is completely performed. Multiple test cases may be applied or derived due to the quantization of the variables of the test cases. This may be seen in the context of a possible application scenario.

For example, a device under test may be tested using the randomly created test cases. For large data sets, it is most likely that the duration of the test, started at the end of a working day, exceeds one night or even a weekend and that therefore, the test is still running in the morning of the next working day and therefore, results are not present. The same counts if the test is interrupted during processing, e.g. due to an error in the test routine or a power outage. Nonetheless, in contrast to known methods which fill a parameter space covering the results of the test in an organized, sorted or regular manner, for example one dimension after the other, the proposed device already covers a huge variety of the parameter space. However, the coverage may be not as dense as in the known approaches. This counts for those dimensions, where the parameter space is already filled regularly by the known approaches, wherein the coverage of those areas of the variable space, which is not already regularly filled by the known approaches may be much denser. However, according to the invention, it is possible to determine dependencies or relations between all used variables of the test cases at an early stage of the test. Using one of the known approaches, dependencies on one or more of the used variables may not have been examined at the same test stage. Moreover, the proposed random test case generation provides the same results, only derived in a different order, than a deterministic approach, if the whole test is performed. Nonetheless, a huge amount of tests is aborted or interrupted during processing. In this case, the random test case generation outperforms the deterministic approach since variables of the random test case generation are nevertheless varied or have a high variation wherein in a classical nested loop for example, the variable of the outmost loop is varied comparably slowly.

Moreover, the data processor 6 may determine a best setting of the device under test 3 based on an optimization target 16, which may be a function of output variables, wherein values of the output variables form the output data 10. In other words, e.g. to form a quality metric such as the (processed) optimization target or figure of merit, the optimization target may weight different output variables derived from the device under test 3 to receive a single function which can be optimized. Based on the optimization target, the data processor may generate a standardized or processed optimization target, such that a small value of the standardized optimization target refers to a good setting of the device under test. The data processor may therefore determine the best setting 11 of the device under test based on the standardized optimization target. This is advantageous, since by using the standardized optimization target, the optimization targets are easily exchangeable or replaceable by other possible standardized optimization targets, since a minimum of the chosen standardized optimization target is in all cases the best case. Otherwise, by replacing a (non-standardized) optimization target, the best achievable value or limit of the optimization target is obviously also to be replaced.

In other words, to simplify optimization, it is convenient to transform variable g(k) into a figure of merit f(k) for each test that can be minimized, i.e. where small is good.

$$f(k) = \begin{cases} +g(k) & \text{Case } a. \\ -g(k) & \text{Case } b. \\ -|g(k) - g_0| & \text{Case } c. \\ |g(k) - g_0| & \text{Case } d. \end{cases} \quad (10)$$

Letters a, b, c, d refer to the options for a good value of variable g described above.

According to further embodiments, the data processor 6 may assign a result of an optimization target 16 for each test case to a respective combination of input variables of each possible combination of input variables 8a and to a respective combination of setting variables 8b of each possible combination of setting variables, wherein, if multiple results of test cases are assigned to the same combination of input variables and the same combination of output variables, a single value 20 representing the multiple results is determined. The single value 20 representing the multiple results of the optimization target may be calculated using the maximum value of the multiple results of the optimization target, the maximum value of the multiple results of the optimization target, or an average value of the multiple results of the optimization target. Embodiments show that the assignment of the result of the optimization target may be applied in a further table. This is advantageous, since each result of the (standardized) optimization target derived using e.g. the non-quantized values of a test case 14, is directly related to the respective combination of (quantized) values of input variables 8a and the respective combination of (quantized) variables of setting variables 8b. Therefore, an output or a result of the optimization value with non-quantized values may be calculated and assigned directly to the quantized representation and is easily accessible by means of computer programming languages.

Therefore, the data processor may assign, for each non-empty field of a table, where indices representing the test cases are stored, a result of an optimization target based on the output values referring to the one or more indices stored in the field to a corresponding field of a further table, wherein, if multiple indices are related to one field, a single value representing the multiple results of the optimization target is assigned to the corresponding field of the further table. In other words, the searched optimization function y(x) 16, is essentially also a function of indices, m(n). Because there can be multiple test cases (or one or none) $\mathcal{K}$(n,m) (cf. table 206) for each pair (n,m), the figure of merit is now consolidated to F(n,m) (cf. table 208) across all test cases in set $\mathcal{K}$(n,m).

$$f(n, m) = \begin{cases} \max_{k \in \mathcal{K}(n,m)} \{f(k)\} & \text{Case } A. \\ \text{avg}_{k \in \mathcal{K}(n,m)} \{f(k)\} & \text{Case } B. \\ \min_{k \in \mathcal{K}(n,m)} \{f(k)\} & \text{Case } C. \end{cases} \quad (11)$$

When $\mathcal{K}$(n,m) is empty, F(n,m) is set to infinity so that it does not affect minimization. Letters A, B, C refer to the options described above.

According to further embodiments, the data processor may determine an index of the best combination of setting variables for the one or more combinations of input variables within at least one test case, wherein the index indicates a unique value of the best combination of setting variables within all possible combinations of values of setting variables. This is advantageous, since similar values of input variables 8a may be quantized to the same representation 8' thereof and, in the context of probably not having a complete test set, not tested with the same combinations of values of input variables. However, it is most likely, that the combination of setting variables which performs best for one test case, performs best or at least near the optimum for all further test cases related to the same quantized values of input variables.

In other words, to find the optimum function y(x), for each combination n=1 . . . N of variables x 8a, the best combination μ(n) 16" across all combinations m=1 . . . M of variables y 8b that minimize the consolidated figure of merit F(n,m) shall be found. Note that a small value of F(n,m) is good.

$$\mu(n) = \underset{m=1\ldots M}{\operatorname{argmin}} \{F(n, m)\} \quad (12)$$

This defines the optimum combination μ(n) 16" of indices for variable values y 8b as a function of combination n of variable values x. In terms of variables x and y, the optimum function is $$y_{\mu(n)}(x_n) \quad (13)$$

To find the optimal test cases, the set $\mathcal{K}_{opt}$ of test cases that satisfy the optimality condition is given by $$\mathcal{K}_{opt} = \{k : m(k) = \mu(n(k))\}. \quad (14)$$

One way to show the effectiveness of optimization is to show the distribution of g(k) for test cases in $\mathcal{K}_{opt}$ compared to all test cases.

Performing optimization, or calibration, is thus equivalent to applying a data set filter based on an expression that is true, when $$m(k) = \mu(n(k)) \quad (15)$$

Therefore, a data set filter for filtering a data set may obtain a best setting 11 of a device under test for current input variables using an optimization vector 16", the optimization vector representing a relation between an index 18a of input variables 8a and an index 18b of a combination of setting variables 8b indicating the best setting of the device under test.

Figure 3:
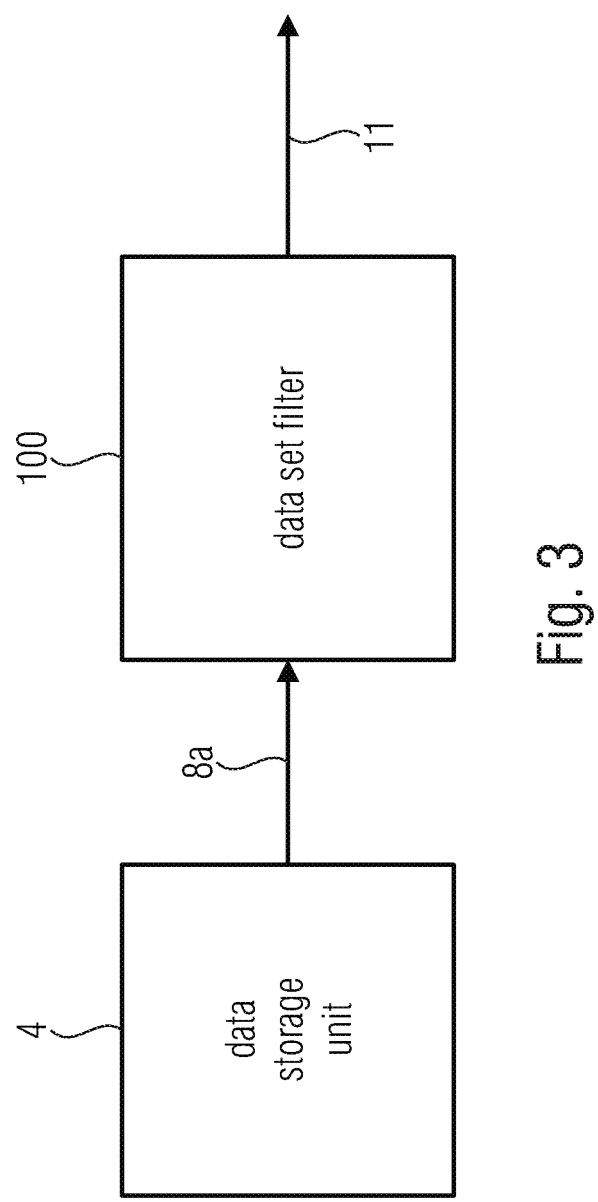
FIG. 3 shows a schematic block diagram of a data set filter.

A schematic representation of the data set filter 100 is shown in FIG. 3. Therefore, input to the optimization vector may be values of input variables 8a, e.g. from the data storage unit 4. Therefore, a currently tested device under test, e.g. not the same but of the same type where the optimization vector was derived from, may be evaluated using the optimization vector 16". This is advantageous, since the finding of the best variable combinations has been performed beforehand and the best value combination may be obtained by only pointing on the corresponding field in the data storage unit. Therefore, and according to further embodiments, the data set filter 100 may be implemented in the device (the earlier device under test now in use) such that the setting variables are set, in real-time, meaning that the output of the device is obtained using the best value combination of setting variables derived from the optimization vector, based on the currently applied values of input variables. Moreover, the data set filter may be part of the test apparatus 2, for example, implemented in the data processor 6 or derived from the data processor 6. However, further embodiments show that the data processor 6 calculates the optimization vector μ(n) which is used by the data set filter 100 to determine the best setting of the device under test. In other words, the test apparatus comprises the data set filter, wherein the data processor is configured to form the optimization vector.

According to embodiments applicable test cases for all combinations of x and y are extracted, where both have been quantized to obtain a tractable number of combinations. Then, for each combination of x, the best combination of y is determined that minimizes a consolidated (e.g. worst case) optimization metric across the applicable test cases. Overall this defines the optimal function ŷ(x). Performing optimization or calibration translates to applying a filter that returns test cases where y(k)=ŷ(x(k)). To verify the effectiveness of optimization or calibration, the behavior of those test cases that satisfy the optimality criteria can be compared against all test cases, e.g. by comparing their distributions of optimization target variable g(k).

Figure 4:
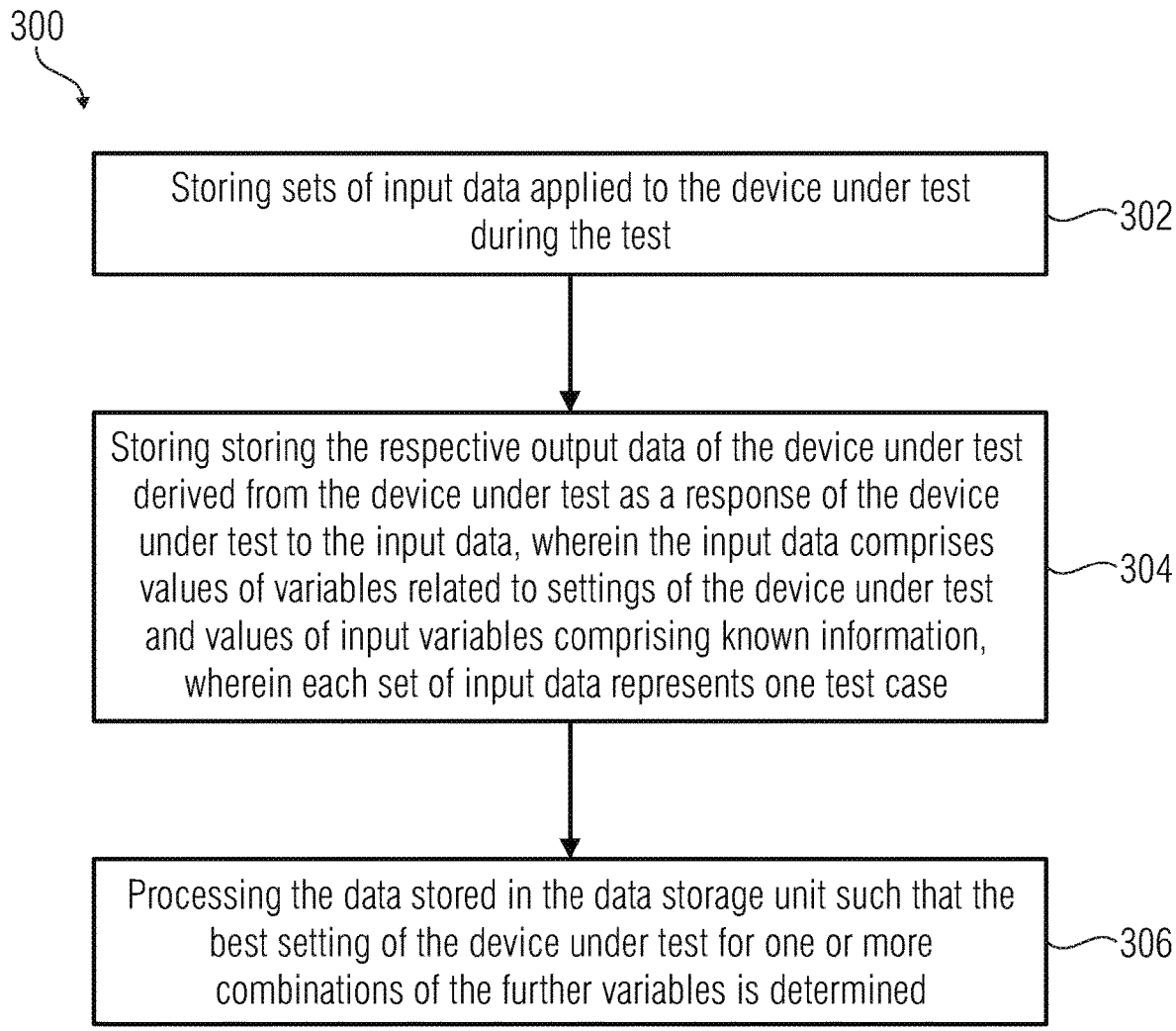
FIG. 4 shows a schematic block diagram of a method for performing a test on a device under test.

FIG. 4 shows a flowchart of a method 300 for performing a test on a device under test 3. The method 300 comprises a step 302 of storing sets of input data applied to the device under test during test, a step 304 of storing the respective output data of the device under test derived from the device under test as a response of the device under test to the input data, wherein the input data comprises values of variables related to settings of the device under test and values of input variables comprising known information, wherein each set of input data represents one test case, and a step 306 of processing the data stored in the data storage unit such that the best setting of the device under test for one or more combinations of the further variables is determined.

Figure 5:
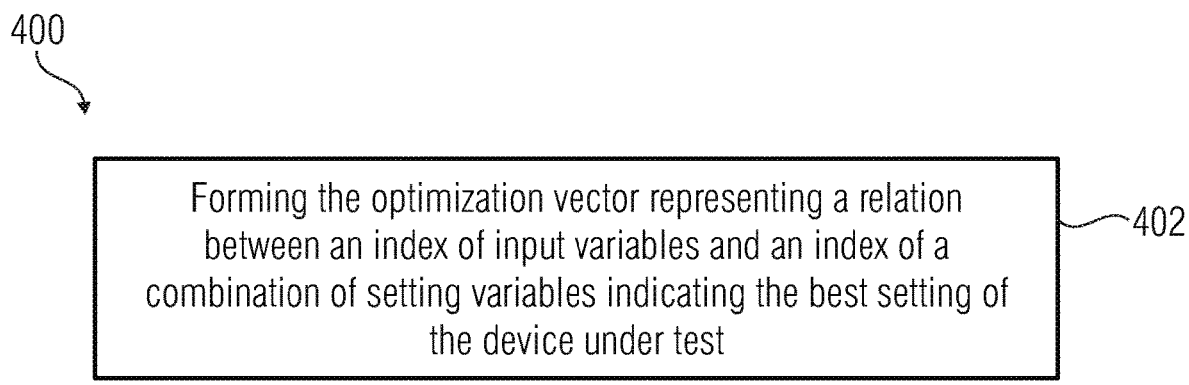
FIG. 5 shows a schematic block diagram of a method for filtering a data set using a data set filter.

FIG. 5 shows a schematic flowchart of a method 400 for filtering a data set to obtain a best setting of a device under test for current input variables using an optimization vector. The method 400 comprises a step 402 of forming the optimization vector representing a relation between an index of input variables and an index of a combination of setting variables indicating the best setting of the device under test.

Although the present invention has been described in the context of block diagrams where the blocks represent actual or logical hardware components, the present invention can also be implemented by a computer-implemented method. In the latter case, the blocks represent corresponding method steps where these steps stand for the functionalities performed by corresponding logical or physical hardware blocks.

Further embodiments of the invention relate to the following examples:

1. Optimization algorithm operating on a fixed subset of (x,y) pairs. Optionally, x and y are multiple variables, e.g. vectors. Further optionally, x and y variables can be a mix of numeric and categorical data. Therefore, numeric variables may be quantized.

2. Moreover, the calibration (of a device under test) may be implemented as a dataset filter.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disc, a DVD, a Blu-Ray, a CD, a ROM, a PROM, and EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive method is, therefore, a data carrier (or a non-transitory storage medium such as a digital storage medium, or a computer-readable medium) comprising, recorded thereon, the computer program for performing one of the methods described herein. The data carrier, the digital storage medium or the recorded medium are typically tangible and/or non-transitory.

A further embodiment of the invention method is, therefore, a data stream or a sequence of signals representing the computer program for performing one of the methods described herein. The data stream or the sequence of signals may, for example, be configured to be transferred via a data communication connection, for example, via the internet.

A further embodiment comprises a processing means, for example, a computer or a programmable logic device, configured to, or adapted to, perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method of performing a test on a device under test, the method comprising:
storing sets of input data applied to the device under test during the test in a memory;
storing in the memory output data derived from the device under test as a response of the device under test to the input data, wherein the input data comprises values of setting variables related to settings of the device under test and values of input variables comprising known information, wherein each set of input data represents one test case; and
processing the data stored in the memory using a hardware processor, wherein the hardware processor configured to:
determine a select combination of the setting variables of a plurality of candidate combinations of the setting variables of the device under test for testing one or more combinations of the input variables;
acquire a selected setting of the device under test of a plurality of candidate settings for testing the one or more combinations of the input variables;
perform a quantization of at least one input variable or at least one setting variable of the input data to form a discrete representation of the input data;
process the discrete representation of the input data to determine the selected setting of the device under test for testing the one or more combinations of the input variables, wherein the selected setting is based on a selection target, wherein the selection target is a function of output variables, and further wherein values of the output variables form the output data; and
assign a unique value to each candidate combination of the input variables or to each candidate combination of the setting variables.

2. A test apparatus for performing a test on a device under test, the test apparatus comprising;
a memory and a hardware processor coupled to the memory;
the memory configured to store sets of input data applied to the device under test during the test and to store output data of the device under test, wherein the output data is acquired from the device under test as a response of the device under test to the input data, wherein the input data comprises values of setting variables related to settings of the device under test and values of input variables comprising further information, wherein each set of input data represents one test case; and
the hardware processor coupled to the memory and configured to:
process the data stored in the memory;
determine a select combination of the setting variables of a plurality of candidate combinations of the setting variables of the device under test for testing one or more combinations of the input variables;
acquire a selected setting of the device under test of a plurality of candidate settings for testing the one or more combinations of the input variables;
perform a quantization of at least one input variable or at least one setting variable of the input data to form a discrete representation of the input data; and
process the discrete representation of the input data to determine the selected setting of the device under test for testing the one or more combinations of the input variables, wherein the selected setting is based on a selection target, wherein the selection target is a function of output variables, and further wherein values of the output variables form the output data; and
assign a unique value to each candidate combination of the input variables or to each candidate combination of the setting variables, wherein the memory comprises the data storage unit and wherein the hardware processor comprises the data processor.

3. The test apparatus according to claim 2, wherein the hardware processor further configured to generate a standardized selection target based on the selection target, wherein a small value of the standardized selection target is associated with setting of the device under test, wherein the hardware processor configured to determine the selected setting of the device under test based on the standardized selection target.

4. The test apparatus according to claim 2, wherein the data hardware processor further configured to assign the unique value to each candidate combination of the input variables using the formula:

$$n(k) = 1 + \sum_{p=1}^{P} (n_p(k) - 1) \prod_{i=1}^{p-1} N_i$$

where k is a current test case, n(k) is a unique value of each candidate combination of the input variables, np(k) is an index representing possible values of an input variable p, P is a total number of input variables p, and N/ is a total number of possible values of input variable i; and wherein the hardware processor further configured to assign the unique value to each candidate combination of the setting variables using the formula:

$$m(k) = 1 + \sum_{p=1}^{P} (m_p(k) - 1) \prod_{j=1}^{p-1} M_j$$

where k is a current test case, m(k) is a unique value of each candidate combination of the setting variables, mp(k) is an index representing possible values of a setting variable p, P is a total number of setting variables p, and Mj is a total number of possible values of setting variable j.

5. The test apparatus according to claim 2, wherein the data hardware processor further configured to assign indices representing test cases to a respective combination of input variables of each possible combination of input variables and to a respective combination of the setting variables of each possible combination of the setting variables.

6. The test apparatus according to claim 5, wherein the hardware processor further configured to form the assignment of indices in a table, wherein a position along a first dimension of the table indicates a unique value of a current input variable within all possible combinations of input variables or wherein the hardware processor further configured to form the assignment of indices in a table, wherein a position along a second dimension of the table indicates a unique value of a current setting variable within all possible combinations of the setting variables.

7. The test apparatus according to claim 2, wherein the hardware processor further configured to:
assign a result of the selection target for each test case to a respective combination of input variables of each possible combination of input variables and to a respective combination of the setting variables of each possible combination of the setting variables; and
responsive to a determination that multiple results of test cases are assigned to a same combination of input variables and a same combination of output variables, determine a single value representing the multiple results.

8. The test apparatus according to claim 7, wherein the hardware processor further configured to calculate the single value representing the multiple results of the selection target using one of: a minimum value of the multiple results of optimization target, a maximum value of the multiple results of the optimization target, and an average value of the multiple results of the selection target.

9. The test apparatus according to claim 2, wherein the hardware processor further configured to determine an index of the select combination of setting variables for the one or more candidate combinations of input variables, wherein the index indicates a unique value of the select combination of setting variables within all possible candidate combinations of values of the setting variables.

10. The test apparatus according to claim 2, wherein the further information comprises at least one of: a stimulus waveform, an input pattern, a stimulus signal, an environment condition, and an environment status.

11. The test apparatus according to claim 2, further comprising: a data set filter for filtering a data set to acquire the selected setting of the device under test for the input variables using a selection vector, wherein the selection vector represents a relation between an index of input variables and an index of a combination of the setting variables and indicates the selected setting of the device under test.

12. A non-transitory digital storage medium having a computer program stored thereon to perform the method of performing a test on a device under test, the method comprising:
storing in a memory sets of input data applied to the device under test during the test;
storing in the memory output data derived from the device under test as a response of the device under test to the input data, wherein the input data comprises values of setting variables related to settings of the device under test and values of input variables comprising known information, wherein each set of input data represents one test case; and
processing the data stored in the memory using a hardware processor, wherein the hardware processor configured to:
determine a select combination of the setting variables of a plurality of candidate combinations of the setting variables of the device under test for testing one or more combinations of the input variables;
acquire a selected setting of the device under test of a plurality of candidate settings for testing the one or more combinations of the input variables;
perform a quantization of at least one input variable or at least one setting variable of the input data to form a discrete representation of the input data; and
process the discrete representation of the input data to determine the selected setting of the device under test for testing the one or more combinations of the input variables, wherein the selected setting is based on a selection target, wherein the selection target is a function of output variables, and further wherein values of the output variables form the output data; and
assign a unique value to each candidate combination of the input variables or to each candidate combination of the setting variables.

13. The method of claim 12, wherein the hardware processor s further configured to generate a standardized selection target based on the selection target, wherein a small value of the standardized selection target is associated with setting of the device under test, wherein the hardware processor configured to determine the selected setting of the device under test based on the standardized selection target.

\* \* \* \* \*